United States Patent [19]

Kishi et al.

[11] Patent Number: 4,626,881
[45] Date of Patent: Dec. 2, 1986

[54] CAPACITOR PRODUCED OF A LAYER COMBINATION OF METAL, INSULATOR AND SEMICONDUCTOR

[75] Inventors: Hiroyasu Kishi; Yuji Kimoto; Keizo Mori, all of Gunma, Japan

[73] Assignees: Sanyo Electric Co., Ltd., Osaka; Tokyo Sanyo Electric Co., Ltd., Gunma, both of Japan

[21] Appl. No.: 658,418

[22] Filed: Oct. 5, 1984

[30] Foreign Application Priority Data

Oct. 17, 1983 [JP] Japan ................. 58-160760[U]

[51] Int. Cl.[4] .................. H01L 29/78; H01L 27/02; H03F 3/45; H03F 3/14
[52] U.S. Cl. .......................... 357/23.6; 357/51; 357/40; 330/302; 330/306; 330/307; 330/253; 333/32
[58] Field of Search .......................... 357/23.6, 51, 40; 307/234; 333/32; 330/253, 307, 302, 306

[56] References Cited

U.S. PATENT DOCUMENTS

| | | | |
|---|---|---|---|
| 3,886,458 | 5/1975 | Matsumoto et al. | 357/23.6 |
| 4,211,941 | 7/1980 | Schade, Jr. | 357/23.6 |
| 4,214,252 | 7/1980 | Goerth | 357/23.6 |
| 4,453,090 | 6/1984 | Sempel | 357/23.6 |

Primary Examiner—Andrew J. James
Assistant Examiner—Terri M. Henn
Attorney, Agent, or Firm—Berman, Aisenberg & Platt

[57] ABSTRACT

A capacitor is disclosed having two capacitor elements of MIS structure, the capacitor elements being connected in a zigzag manner to realize a balanced parallel connection for the capacitor elements. A circuit having a pair of balanced impedance branches, the branches being bridged by the balanced parallel capacitor disclosed above, resultantly sustains the impedance branches balanced regardless of the amount of the parasitic capacity involved.

6 Claims, 11 Drawing Figures

CAPACITOR PRODUCED OF A LAYER COMBINATION OF METAL, INSULATOR AND SEMICONDUCTOR

FIELD OF THE INVENTION

This invention relates to a capacitor produced of a layer combination of metal, insulator and semiconductor. More specifically, this invention relates to an improvement applicable to a capacitor which is produced in a semiconductor device and which is produced of a layer combination of the metal-insulator-semiconductor structure, the improvement being effective of decrease the amount of parasitic capacity thereof. Further, this invention relates to an improvement applicable to a circuit having a pair of branches of which the effect of impedance is identical to each other and each of which is connected to each other through a capacitor, the circuit being produced of a layer combination of the metal-insulator-semiconductor structure, the improvement being effective to balance the amount of parasitic capacity accompanying each branch, resultantly removing the adverse effects of parasitic capacity to the aforementioned circuit having a pair of balanced impedance branches which are connected through a capacitor.

BACKGROUND OF THE INVENTION

Since a semiconductor device is an electronic device extremely small in size and which is produced of accumulated semiconductor layers, the semiconductor device is unexpectedly accompanied by one or more parasitic capacities.

A parasitic capacity which accompanies a capacitor produced in a semiconductor device will be described below:

Referring to FIG. 1, a capacitor is produced of a combination of (a) an N+-silicon layer 6 diffused in an N-silicon layer 5 which is grown on a P-silicon substrate 3 and which is isolated by P-silicon regions 4, (b) a silicondioxide film 2 produced on the N+-silicon layer 6 and (c) a metal plate 1 produced on the silicondioxide film 2. The capacitor realizes a capacity $C_o$ between terminals A and B and parasitic capacity $C_s$ between the N-silicon layer 5 and the P-silicon substrate 3 or the earth. The equivalent circuit diagram of the above described semiconductor device is illustrated in FIG. 2.

The adverse effects of a parasitic capacity is itemized below:

1. Firstly, since a parasitic capacity is a type of junction capacity, the amount is determined depending on the amount of bias voltage applied across the junction. This means that the amount of a parasitic capacity fluctuates, following the amount of bias voltage applied across the corresponding junction.

2. Secondly, since a semiconductor device is inherently a group of accumulated semiconductor layers, the amount of parasitic capacity is large enough to garble the circuit constants of a circuit produced in a semiconductor device.

3. Thirdly, it is not easy to anticipate the accurate amount of a parasitic capacity.

4. Fourthly, the adverse effects of a parasitic capacity is extremely serious particularly for a circuit having a pair of branches of which the amount of impedance is identical to each other and each of which is connected to each other through a capacitor (hereinafter referred to as a balanced circuit), e.g. a differential amplifier, a phase shifter et al. This is because one branch alone of the balanced circuit is accompanied by a parasitic capacity $C_s$, as illustrated in FIG. 3, resultantly garbling the impedance of one of the branches. Referring to the drawing which illustrates a differential amplifier consisting of resistors $R_1$ and $R_2$, a capacitor $C_o$, transistors $Q_1$ and $Q_2$, a load resistor L and a constant current power supply PS, the first branch consisting of the resistor $R_1$ and the transistor $Q_1$ is accompanied by a parasitic capacity $C_s$, although the second branch consisting of the resistor $R_2$ and the transistor $Q_2$ is not accompanied by a parasitic capacity $C_s$. As a result, the transistors $Q_1$ and $Q_2$ can not be applied a balanced set of input signals, resulting in a garbled characteristic of the differential amplifier. Accordingly, a parasitic capacity readily causes an unexpected garble for the characteristics of a functional device employing any type of balanced circuits.

OBJECTS AND SUMMARY OF THE INVENTION

The first object of this invention is to provide a MIS having a balanced impedance wherein the impedance seen from one electrode is equal to the impedance seen from a second electrode.

The second object of this invention is to provide a capacitor produced of a layer combination of metal, insulator and semiconductor, which combination of layers is produced on an insulator plate, wherein the improvement is that the capacitor is accompanied by a parasitic capacity having a smaller effect.

The third object of this invention is to provide a circuit having a pair of branches of which the amount of impedance is identical to each other and each of which is connected to each other through a capacitor, the circuit being produced of a layer combination of metal, insulator and semiconductor, wherein the improvement is that the capacitor bridging the branches is accompanied by two parasitic capacities each of which has an impedance of which the amount is identical to each other and each of which is connected to each side of the capacitor, resultantly the impedance of each branch is maintained at an amount identical to each other, regardless of the amount of the parasitic capacity.

The fourth object of this invention is to provide a circuit having a pair of branches of which the amount of impedance is identical to each other and each of which is connected to each other through a capacitor, the circuit being produced of a layer combination of metal, insulator and semiconductor, which combination of layers is produced on an insulator plate, wherein the improvement is that the capacitor bridging the branches is accompanied by two parasitic capacities each of which is connected to each side of the capacitor and each of which has an impedance of which the amount is identical to each other, resultantly, the impedance of each branch is maintained at an amount identical to each other, regardless of the amount of the parasitic capacity.

To achieve the first object of this invention, a capacitor produced of a layer combination of metal, insulator and semiconductor, in accordance with the first embodiment of this invention is provided:

(1) a first capacitor element and a second capacitor element each of which is a capacitor having a metal-insulator-semiconductor structure, (2) a first wiring terminal connecting with the first metal plate of the first capacitor element and with the second metal plate of the second capacitor element, and (3) a second wiring terminal connecting with the second metal plate of the first capacitor element and with the first metal plate of the second capacitor element.

To achieve the second object of this invention, a capacitor produced of a layer combination of metal, insulator and semiconductor, which combination of layers is produced on an insulator plate, in accordance with the second embodiment of this invention, is provided an insulator plate e.g. a glass plate on which a capacitor which is identical to that which was described above as the first embodiment of this invention, is provided.

To achieve the third object of this invention, a circuit having a pair of branches of which the amount of impedance is identical to each other and each of which is connected to each other through a capacitor, the circuit being produced of a layer combination of metal, insulator and semiconductor, in accordance with the third embodiment of this invention, is provided:

(1) a pair of branches of which the amount of impedance is identical to each other, and (2) a capacitor which connects the branches to each other and which is further provided:

(a) a first capacitor element and a second capacitor element each of which is a capacitor having a metal-insulator-semiconductor structure, (b) a first wiring terminal connecting with the first metal layer of the first capacitor element and with the second metal layer of the second capacitor element, and (c) a second wiring terminal connecting with the second metal layer of the first capacitor element and with the first metal layer of the second capacitor element.

As is in the case of the first embodiment of this invention, the capacitor consists of two capacitor elements each of which is accompanied by a parasitic capacity at one electrode alone. In other words, such a capacity is realized between a semiconductor layer or the second metal plate and the earth. The foregoing connection of wiring terminals is effective to allocate the two parasitic capacities to each of the two branches, resultantly sustaining the impedance of each branch identical to each other.

To achieve the fourth object of this invention, a circuit having a pair of branches of which the amount of impedance is identical to each other and each of which is connected to each other through a capacitor, the circuit being produced of a layer combination of metal, insulator and semiconductor, which combination of layers is produced on an insulator plate, in accordance with the fourth embodiment of this invention, is provided an insulator plate e.g. a glass plate on which a circuit which is identical to that which was described above as the third embodiment of this invention, is provided.

BRIEF DESCRIPTION OF THE DRAWINGS

This invention, together with its various features and advantages, can be readily understood from the following more detailed description presented in conjunction with the following drawings, in which.

DETAILED DESCRIPTION

Figure 1:
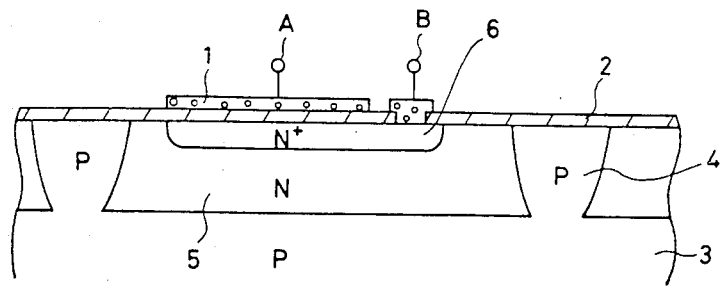
FIG. 1 is a cross-sectional view of a capacitor produced of a layer combination of metal, insulator and semiconductor available in the prior art.
Figure 2:
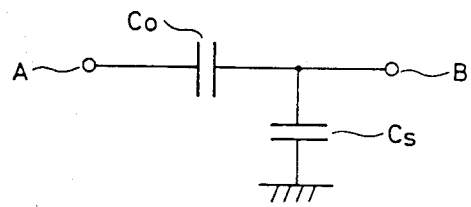
FIG. 2 is an equivalent circuit diagram of the capacitor of which the cross-sectional view is illustrated in FIG. 1.
Figure 3:
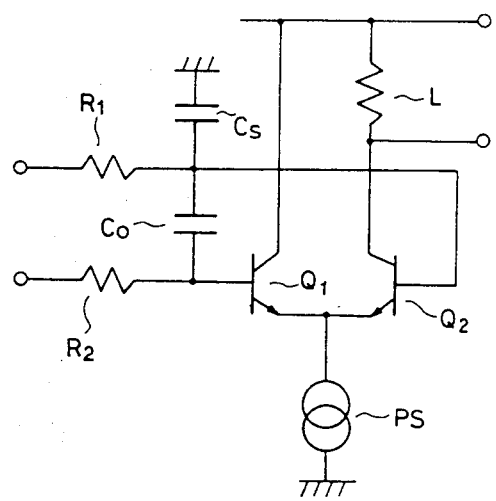
FIG. 3 is a circuit diagram of a differential amplifier, an example of a balanced circuit, available in the prior art.
Figure 4:
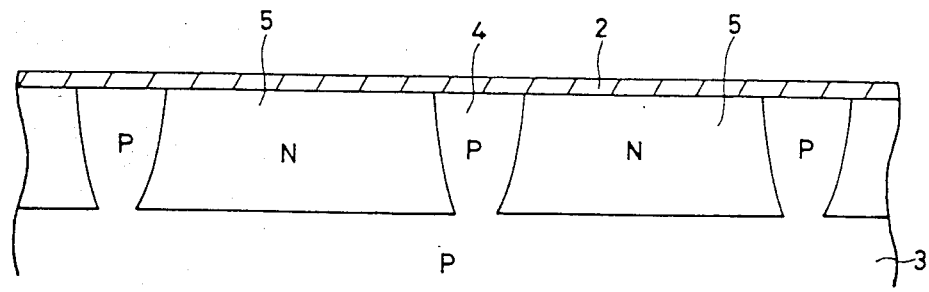
FIG. 4 is a cross-sectional view of an Si substrate after completion of the isolation process for production of a capacitor in accordance with the first embodiment of this invention.

Referring to FIGS. 4 through 7, a process for production of a capacitor of MIS structure in accordance with the first embodiment of this invention will be described below:

Referring to FIG. 4, a chemical vapor deposition process is employed to grow an N-silicon layer 5 on a P-silicon substrate 3. At the last stage of the process, a silicondioxide film 2 grows on the surface of the N-silicon layer 5.

A combination of a photolithography process and a chemical etching process is employed to remove the silicondioxide film 2 from the top of isolation regions 4. A P-impurity is introduced to the isolation regions 4. A heat process is employed to activate and/or diffuse the P-impurity. At the last stage of this heat process, the silicondioxide film 2 is recovered on the top of the isolation region 4.

Figure 5:
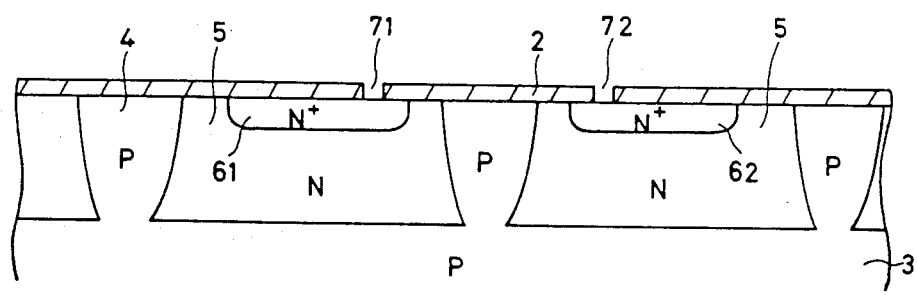
FIG. 5 is a cross-sectional view of an Si substrate after completion of N+-layers and contact holes for a second metal plate the capacitor shown in FIG. 4.

Referring to FIG. 5, a combination of a photolithography process and a chemical etching process is employed to partly remove the silicondioxide film 2 from the area at which a capacitor is scheduled to be produced. An N-impurity is introduced to the area exposed by the above step. A heat process is employed to activate and/or diffuse the N-impurity. As a result, N+-silicon layers 61 and 62 have been produced. During the heat process, a silicon dioxide film 2 is recovered on the top of the N+-silicon layers 61 and 62. The N+-silicon layer 61 will be a component of the first capacitor element 101 in combination with the silicondioxide film 2 and a first metal plate 111 which will be produced in a later step, and the N+-silicon layer 62 will be a component of the second capacitor element 102 in combination with the silicondioxide film 2 and a second metal plate 112 which will be produced in a later step.

A combination of a photolithography process and a chemical etching process is employed to remove the siliconfioxide film 2 from the areas 71 and 72 at which second metal plates 121 and 122 are scheduled to be placed respectively for the first capacitor element 101 and the second capacitor element 102.

Figure 6:
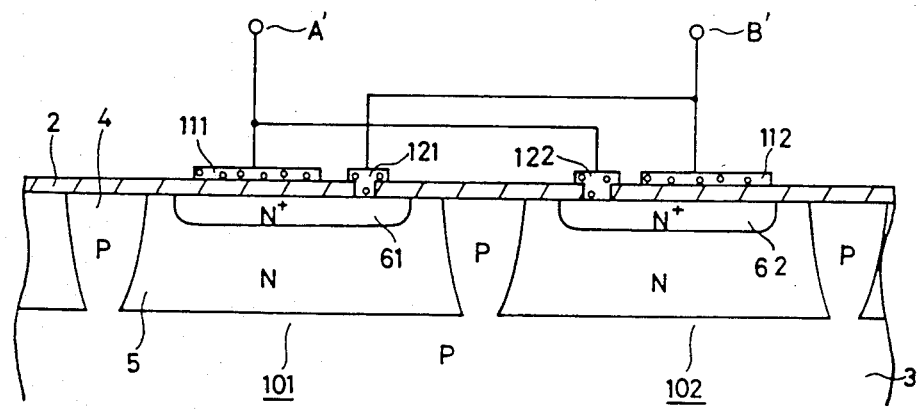
FIG. 6 is a cross-sectional view of a capacitor in accordance with the first embodiment of this invention.
Figure 7:
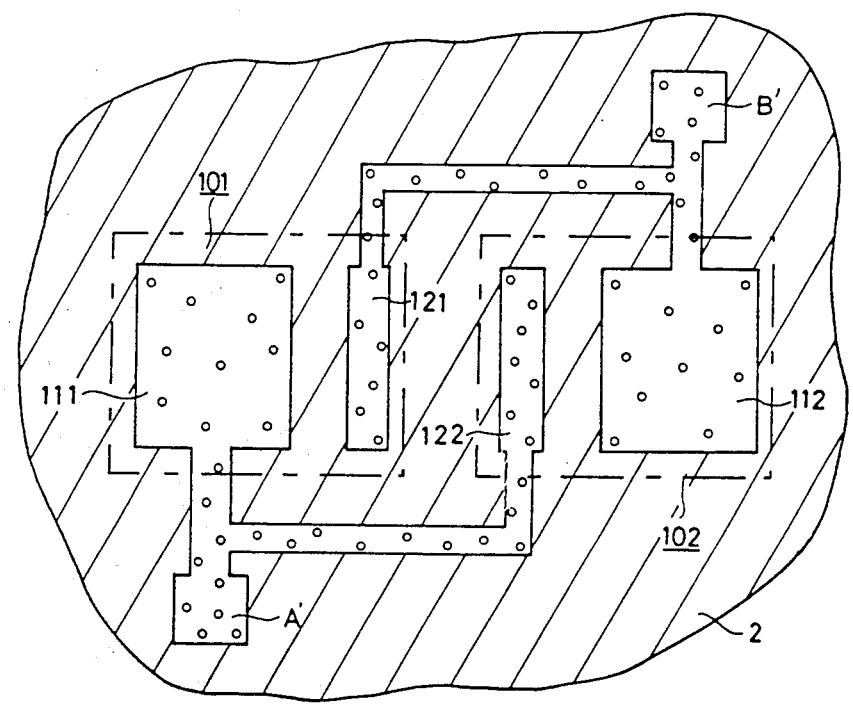
FIG. 7 is a plan view of a capacitor in accordance with the first embodiment of this invention.

Refering to FIGS. 6 and 7, after a metal layer is deposited on the entire surface of the silicondioxide film 2, a combination of a photolithography process and a chemical etching process is employed to partly remove the metal layer, resultantly producing the first metal plate 111 and the second metal plate 121 of the first capacitor element 101 and the first metal plate 112 and the second metal plate 122 of the second capacitor element 102, and a first wiring terminal A' and a second wiring terminal B'.

Accordingly, the first capacitor element 101 consists of the first metal plate 111, the silicondioxide film 2, and N+-silicon layer 61 and the second metal plate 121. Similiarly, the second capacitor element 102 consists of the first metal plate 112, the silicondioxide film 2, the N+-silicon layer 62 and the second metal plate 122. The first capacitor element 101 and the second capacitor element 102 are connected with each other in a type of zig-zag manner. In other words, the first wiring terminal A' is connected to the first metal plate 111 of the first capacitor element 101 and the second metal plate 122 of the second capacitor element 102. The second wiring terminal B' is connected to the first metal plate 112 of the second capacitor element 102 and the second metal plate 121 of the first capacitor element 101.

Figure 8:
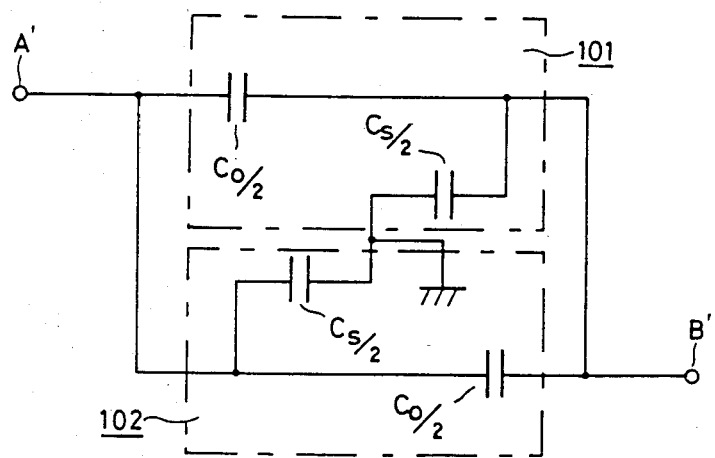
FIG. 8 is an equivalent circuit diagram of a capacitor in accordance with the first embodiment of this invention.

FIG. 8 illustrates an equivalent circuit diagram of the capacitor produced by the foregoing steps. Referring to the drawing, the capacity $C_o/2$ realized in the first capacitor element 101 and the capacity $C_o/2$ realized in the second capacitor element 102 are connected in parallel to realize a capacity $C_o$.

Figure 9:
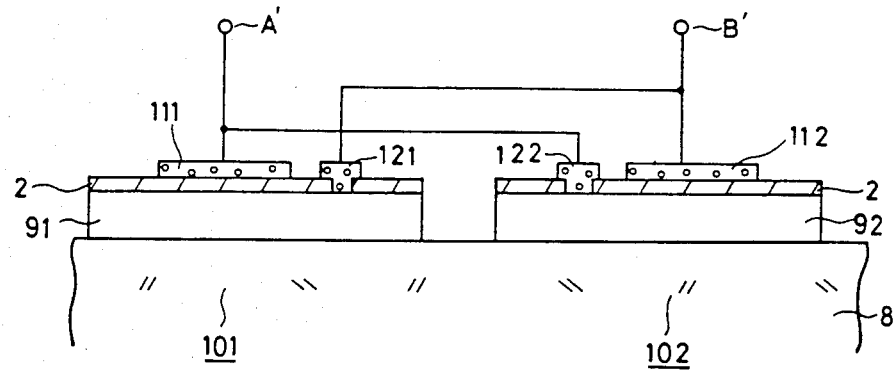
FIG. 9 is a cross-sectional view of a capacitor in accordance with the second embodiment of this invention.

Referring to FIG. 9, a capacitor of MIS structure produced on an insulator plate in accordance with the second embodiment of this invention will be described below:

Referring to FIG. 9, a pair of mesa shaped N-silicon layers 91 and 92 are deposited on an insulator plate 8 e.g. a glass plate. The N-silicon layers 91 and 92 need not be single crystalline silicon layers. In other words, this embodiment can be realized in a thin film transistor type semiconductor device. Each of the silicon layers 91 and 92 is covered by a silicondioxide film 2. In the manner identical to that of the first embodiment, first metal plates 111 and 112 respectively of the first capacitor element 101 and of the second capacitor element 102 and second metal plates 121 and 122 respectively of the first capacitor element 101 and of the second capacitor element 102, are produced on the silicondioxide films 2. A first capacitor element 101 consists of the first metal plate 111, the silicondioxide film 2, the N-silicon layer 91 and the second metal plate 121, and a second capacitor element 102 consists of the first metal plate 112, the silicondioxide film 2, the N-silicon layer 92 and the second metal plate 122. Further, first and second wiring terminals A' and B' are produced and connected also in the manner identical to that of the first embodiment.

Figure 10:
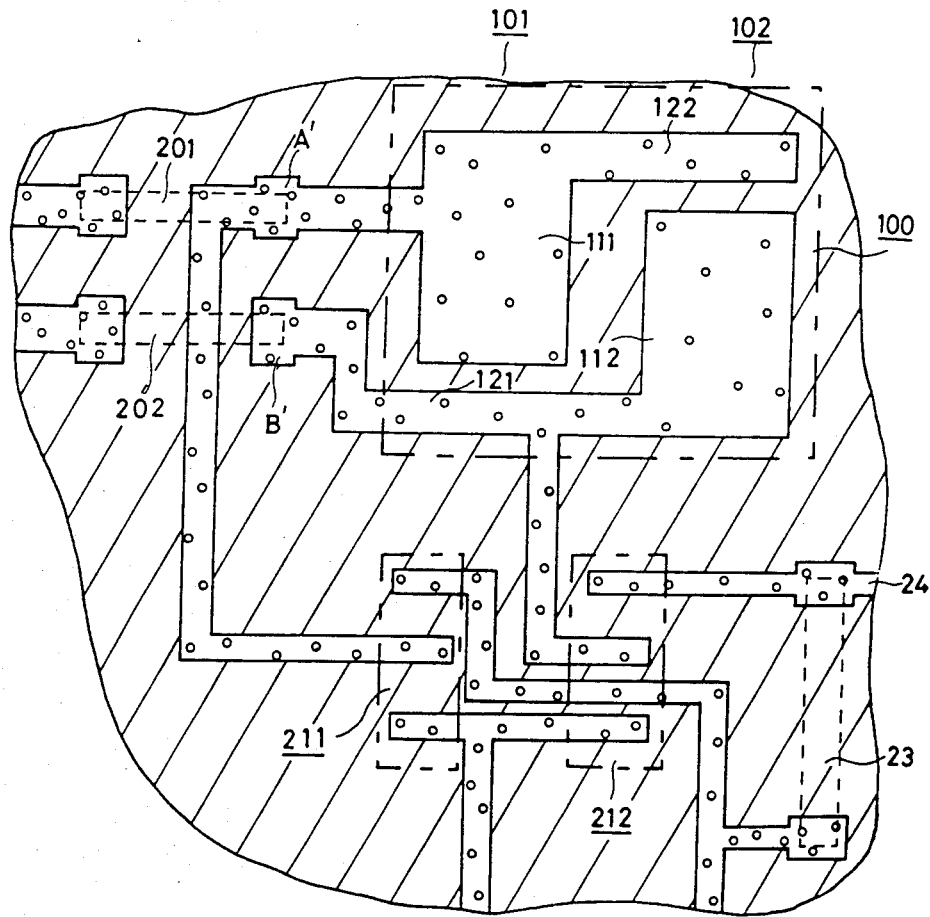
FIG. 10 is a plan view of a balanced circuit in accordance with the third embodiment of this invention.
Figure 11:
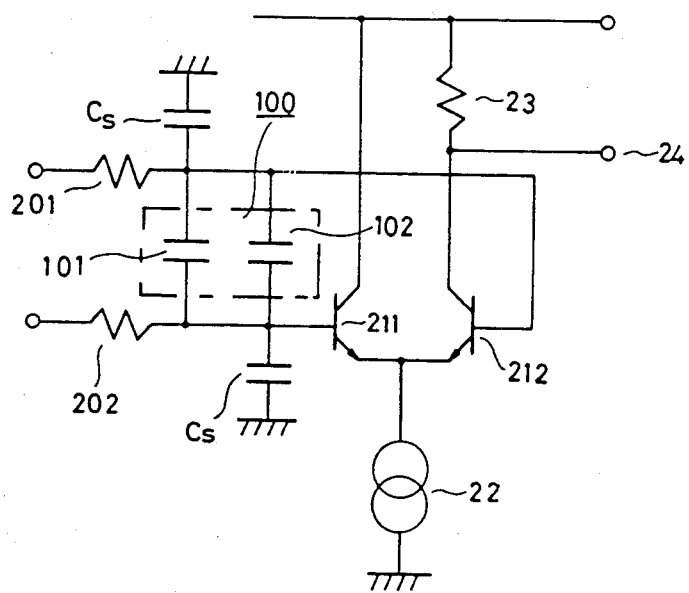
FIG. 11 is an equivalent circuit diagram of a balanced circuit in accordance with the third embodiment of this invention.

Referring to FIGS. 10 and 11, a circuit having a pair of branches of which the amount of impedance is identical to each other and each of which is connected to each other through a capacitor, the circuit being produced of MIS structure, in accordance with the third embodiment of this invention will be described below:

Referring to FIGS. 10 and 11 illustrating respectively a plan view and an equivalent circuit diagram of a differential amplifier, an example of a balanced circuit, produced of MIS structure, each branch of the balanced circuit including a balanced pair of resistors 201 and 202 and a pair of NPN transistors 211 and 212, branches being connected to each other through a capacitor 100 which is precisely identical to that which was described above for the first embodiment. Since the capacitor 100 consists of a first capacitor element 101 and a second capacitor element 102, and since these capacitor elements 101 and 102 are connected in a zigzag manner, each branch 201 and 202 is provided a parasitic capacity $C_s$ of which the amount is identical to each other and is individually grounded. As a result, each branch of this balanced circuit is allowed to have an impedance of which the amount is identical to each other, regardless of the amount of the parasitic capacity involved. This means the adverse effects of the parasitic capacity is removed from the foregoing balanced circuit produced of MIS structure, allowing the balanced circuit to function as is expected. Numerals 22, 23 and 24 respectively indicate a constant current power supply, a load resistor and an output terminal.

It will be clear to any person skilled in the art that the foregoing circuit can readily be produced of a semiconductor layer combination and, a redundant description of the detailed layer configuration is not presented here.

The foregoing description has clarified that a circuit produced of MIS structure and which has a pair of branches of which the amount of impedance is identical to each other and each of which is connected to each other through a capacitor, wherein the pair of branches is sustained in a position in which the impedance is balanced, regardless of the amount of parasitic capacity accompanying the capacitor bridging the branches, is successfully provided.

It is clear for any person skilled in the art that the balanced circuit in accordance with the third embodiment of this invention can be produced on an insulator plate. In this case, the capacitor included in the balanced circuit turns out to be identical to that which is the second embodiment of this invention. Further, in this case, the semiconductor layers need not be single crystalline semiconductor layers. This means that this embodiment can be applied to TFT type structure which is prevailingly employed for panel displays and the like.

Accordingly, it is clear from a combination of the foregoing descriptions that a circuit having a pair of branches of which the amount of impedance is identical to each other and each of which is connected to each other through a capacitor, the circuit being produced of a layer combination of metal-insulator-semiconductor, which combination of layers is produced on an insulator plate, wherein the pair of branches is sustained in a position in which the impedance is balanced, regardless of the amount of parasitic capacity accompanying the capacitor bridging the branches, is successfully provided.

Although this invention has been described with reference to specific embodiments, this description is not meant to be construed in a limiting sense. Various modifications of the disclosed embodiments, as well as other embodiments of this invention, will be apparent to persons skilled in the art upon reference to the foregoing description of this invention. It is therefore contemplated that the appended claims will cover any such modifications or embodiments as fall within the true scope of this invention.

What is claimed is:

1. A capacitor comprising a layer combination of metal, insulator and semiconductor comprising:
   a first capacitor element comprising a semiconductor layer, an insulator film placed on said semiconductor layer, a first metal plate placed on said insulator layer and a second metal plate placed on said semiconductor layer,
   a second capacitor element having a capacitance equal to that of said first capacitor element and comprising a semiconductor layer, an insulator film placed on said semiconductor layer, a first metal plate placed on said insulator layer and a second metal plate placed on said semiconductor layer,
   a first wiring terminal connecting with said first metal plate of said first capacitor element and with said second metal plate of said second capacitor element, and
   a second wiring terminal connecting with said second metal plate of said first capacitor element and with said first metal plate of said second capacitor element whereby a parasitic capacitance accompanying said first capacitor element is connected with said second wiring terminal and a parasitic capacitance accompanying said second capacitor element is connected with said first wiring terminal resultantly balancing the parasitic capacitances on both of said first and second wiring terminals.

2. A capacitor according to claim 1, wherein said first capacitor element and said second capacitor element are on an insulator plate.

3. A circuit having a pair of branches of which the amount of impedance is identical to each other and each of which is connected to each other through a capacitor, said circuit being a layer combination of metal, insulator and semiconductor, comprising:
   a pair of branches of which the amount of impedance is identical to each other, each of said branches being a layer combination of metal, insulator and semiconductor, and capacitor means connecting said branches,
   said capacitor means comprising:
   a first capacitor element comprising a semiconductor layer, an insulator film placed on said semiconductor layer, a first metal plate placed on said insulator layer and a second metal plate placed on said semiconductor layer,
   a second capacitor element having a capacitance equal to that of said first capacitor element and comprising a semiconductor layer, an insulator film placed on said semiconductor layer, a first metal plate placed on said insulator layer and a second metal plate placed on said semiconductor layer,
   a first wiring terminal connected to said first metal plate of said first capacitor element and to said second metal plate of said second capacitor element, and
   a second wiring terminal connected to said second metal plate of said first capacitor element and to said first metal plate of said second capacitor element.

4. A circuit having a pair of branches of impedance is identical to each other and each of which is connected to each other through a capacitor, said circuit as defined in claim 3, wherein said circuit is on an insulator plate.

5. A balanced circuit comprising a pair of transistors connected to each other in a differential configuration, a pair of input circuit branches each of which is connected to the base of a respective one of said pair of transistors, and capacitor means bridging said pair of branches,
   wherein said capacitor means comprises:
   a first capacitor element comprising a semiconductor layer, an insulator film placed on said semiconductor layer, a first metal plate placed on said insulator layer and a second metal plate placed on said semiconductor layer,
   a second capacitor element having a capacitance equal to that of said first capacitor element and comprising a semiconductor layer, an insulator film placed on said semiconductor layer, a first metal plate placed on said insulator layer and a second metal plate placed on said semiconductor layer,
   a first wiring terminal connected to said first metal plate of said first capacitor element and to said second metal plate of said second capacitor element, and a second wiring terminal connected to said second metal plate of said first capacitor element and to said first metal plate of said second capacitor element, whereby said balanced circuit maintains a balanced impedance regardless of the effects of parasitic capacity.

6. A balanced circuit defined in claim 5, wherein said circuit is on an insulator plate.

* * * * *